(12) United States Patent
Soules et al.

(10) Patent No.: US 7,319,246 B2
(45) Date of Patent: Jan. 15, 2008

(54) LUMINESCENT SHEET COVERING FOR LEDS

(75) Inventors: Thomas F. Soules, Livermore, CA (US); Chen-Lun Hsing Chen, Sanchong (TW); Emil Radkov, Euclid, OH (US)

(73) Assignee: Lumination LLC, Valley View, OH (US)

( * ) Notice: Subject to any disclaimer, the term of this patent is extended or adjusted under 35 U.S.C. 154(b) by 0 days.

(21) Appl. No.: 11/159,964

(22) Filed: Jun. 23, 2005

(65) Prior Publication Data

US 2006/0289884 A1 Dec. 28, 2006

(51) Int. Cl.
*H01L 31/0203* (2006.01)
(52) U.S. Cl. .................. 257/100; 257/98; 257/99; 257/E25.032
(58) Field of Classification Search .................. 257/100
See application file for complete search history.

(56) References Cited

U.S. PATENT DOCUMENTS

| | | |
|---|---|---|
| 5,634,711 A | 6/1997 | Kennedy et al. |
| 5,962,971 A | 10/1999 | Chen |
| 6,048,616 A | 4/2000 | Gallagher et al. |
| 6,207,229 B1 | 3/2001 | Bawendi et al. |
| 6,357,889 B1 | 3/2002 | Duggal et al. |
| 6,366,033 B1 | 4/2002 | Greci et al. |
| 6,635,363 B1 * | 10/2003 | Duclos et al. ............. 428/690 |
| 6,878,973 B2 * | 4/2005 | Lowery et al. ............. 257/100 |
| 2001/0000622 A1 * | 5/2001 | Reeh et al. .................. 257/98 |
| 2002/0043926 A1 | 4/2002 | Koichi et al. |
| 2002/0079506 A1 | 6/2002 | Kuniaki et al. |
| 2002/0084748 A1 | 7/2002 | Ayala et al. |
| 2004/0046242 A1 * | 3/2004 | Asakawa .................... 257/678 |
| 2005/0073846 A1 * | 4/2005 | Takine ........................ 362/296 |
| 2005/0093430 A1 * | 5/2005 | Ibbetson et al. ............ 313/501 |
| 2005/0104076 A1 * | 5/2005 | Mueller-Mach et al. ...... 257/89 |
| 2005/0151147 A1 * | 7/2005 | Izuno et al. .................. 257/98 |
| 2005/0174806 A1 * | 8/2005 | Sakai et al. ................. 362/615 |
| 2005/0200269 A1 * | 9/2005 | Ng et al. ..................... 313/502 |

FOREIGN PATENT DOCUMENTS

| | | |
|---|---|---|
| EP | 1 191 608 A | 3/2002 |
| WO | WO 2004 021461 A2 | 3/2004 |
| WO | WO 2004 100226 A2 | 11/2004 |

* cited by examiner

*Primary Examiner*—Minhloan Tran
*Assistant Examiner*—Eduardo A. Rodela
(74) *Attorney, Agent, or Firm*—Fay Sharpe LLP

(57) ABSTRACT

A lighting apparatus comprising at least one light emitting diode is disposed on an interconnect board to emit ultraviolet or blue radiation. A polymeric layer including a luminophor is disposed about the lighting apparatus to convert at least a portion of the radiation emitted from the LED into visible light. The polymeric layer is shrinkable to conform to a shape enclosing the light emitting diode.

27 Claims, 4 Drawing Sheets

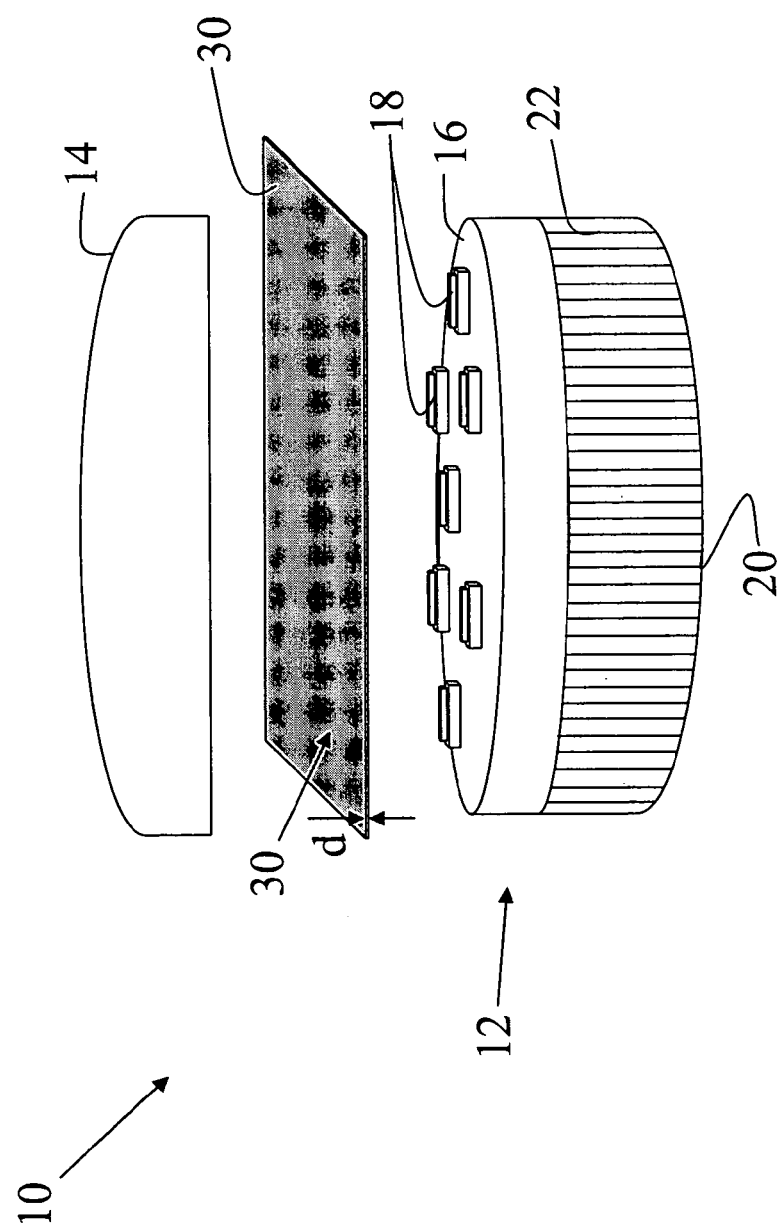

LUMINESCENT SHEET COVERING FOR LEDS

BACKGROUND

The present application relates to the art of the LED lighting systems that produce visible light. It finds application in general purpose lighting and will be described with particular reference thereto. Those skilled in the art will appreciate the applicability of the present application to a variety of applications such as ornamental, special effects lighting, and other.

Typically, the LED lighting systems, which produce white or visible light incorporate blue LEDs, are coated with phosphor that converts some of the blue light radiation to a complimentary color, e.g. yellow-green emission. Combined blue, yellow and green emissions produce a white light.

Some white LED lighting systems unitize a blue LED chip coated with phosphors which are designed to convert some of the blue radiation into complementary colors. An example of a commonly used phosphor for this purpose is the yellow emitting yttrium gadolinium aluminum garnet phosphor activated with $Ce^{3+}$. Other types of white LED lighting systems use an ultra violet emitting (UV) chip coated with a combination of phosphors producing white light.

To produce a white light of a correct color, a uniform coating of the phosphor powder of precise thickness is required. For the blue-emitting chips, a uniform coating of the prespecified thickness is required to allow a fixed amount of blue radiation to be transmitted through the coating to produce the correct whiteness of the color. In addition, the uniform thickness of phosphor coating is required to avoid some regions of the coated chip emitting predominately blue radiation and other regions emitting predominantly yellow radiation, which produce a pattern of varying colors in the projected light.

Likewise, the uniform phosphor coating and precise thickness are required for the UV emitting chips of the white LED lighting systems. A thicker coating is needed to avoid a bleed-through of large amounts of the UV, while an extra thick coating causes excessive scattering of the UV and visible light back onto the LED and surrounding structures. Some of the radiation, which is scattered or reflected back onto the LED, can be absorbed by the chip, reflector, submount, and/or lead structure resulting in a decrease of the light output.

One method to produce a phosphor coating is to use a phosphor slurry which includes phosphor in a liquid medium, an epoxy, or a silicone. In a slurry, phosphor particles are distributed randomly but settle quickly which results in different phosphor thicknesses over the geometry of the coating. Another method is to spray the chip with the slurry as in the screen printing. Yet another solution is to electrophoretically coat the chip or spray coat the lens.

However, because the LEDs and LED components are small and often irregular in shape, it is difficult to obtain a uniform distribution of coating. The coating naturally drains off corners and high points in the LED structure. Furthermore, it is difficult to produce a uniform thickness from one part of the LED to another.

The present application contemplates a new and improved apparatus that overcomes the above-reverenced problems and others.

BRIEF DESCRIPTION

In accordance with one aspect, a lighting apparatus is disclosed. At least one light emitting diode is disposed on an interconnect board to emit ultraviolet or blue radiation, which light emitting diode includes a first surface to emit radiation, and a second surface disposed opposite the first surface. A polymeric layer including a luminophor is disposed about the lighting apparatus to convert at least a portion of the radiation emitted from the LED into visible light, which polymeric layer is shrinkable to conform to a shape enclosing the light emitting diode.

In accordance with another aspect, a method of manufacturing a lighting apparatus is disclosed. A polymeric material is liquefied. Phosphor powder is stirred into the liquefied polymeric material until the phosphor powder is one of suspended, dispersed or substantially dissolved. A polymeric sheet is formed from the phosphor including polymeric liquid. At least one LED is positioned on a mounting surface. The phosphor including polymeric sheet is shrink-wrapped around objects to surround light emitted by the LED.

One advantage of the present application resides in improved uniformity of a phosphor coating.

Another advantage resides in a phosphor coating with controlled thickness of phosphor.

BRIEF DESCRIPTION OF THE DRAWINGS

The application may take form in various components and arrangements of components, and in various steps and arrangements of steps. The drawings are only for purposes of illustrating the preferred embodiments and are not to be construed as limiting the application.

FIG. 1 is a schematic view of an LED lighting assembly;

DETAILED DESCRIPTION

Figure 3:
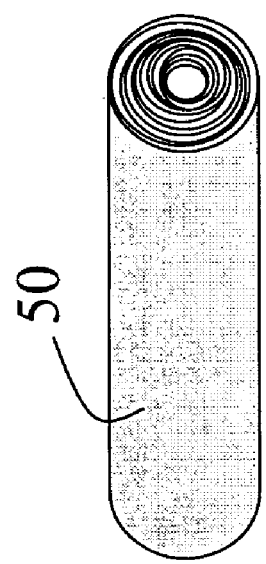
FIG. 3 is an illustration of a polymeric phosphor roll.

With reference to FIG. 1, an LED light assembly 10 comprises a light engine 12 and an enclosure 14 which surrounds the radiation emitted by the light engine 12. The light engine 12 includes an interconnect system or boards or mounting surface or printed circuit board 16 for mounting and connecting light emitting devices or LEDs 18 such as chip or packaged LEDs emitting blue or ultra-violet (UV) radiation. A heatsink 20, including a plurality of heat dissipating elements such as wings 22, is disposed in thermal connection with the LEDs 18 and the interconnect system 16 to dissipate heat generated by the LEDs 18. Preferably, the interconnect system 16 includes circuitry for powering the LEDs 18 and leads for electrical communication with a power source. The interconnect boards 16 are selected from commercially available circuit boards, such as the circuit boards available from BERGQUIST, to provide suitable means for removing heat generated by the LEDs 18 and dissipating it in the heatsink 20. For example, the interconnect board 16 is a thermally conductive type, an epoxy glass resin board with thermal vias, or the like. In one embodiment, the light assembly 10 utilizes internal or external electronics to achieve the desired voltage and current drive levels. In another embodiment, series and/or parallel circuits are created to provide the desired operating voltage and improve reliability of the overall system.

The LEDs 18 are attached to the interconnect board(s) 16 in arrays or strips depending on the requirements of the lighting system. In one embodiment, in which the packaged LEDs are used, the LEDs 18 are soldered, adhered by a use of a conductive adhesive, or otherwise conductively fastened to the interconnect board 16. In another embodiment, in which the chip LEDs or LEDs on submounts are used, the LEDs 18 are directly attached to the interconnect board 16 by a use of a thermally conductive adhesive and are electrically wirebonded to the circuitry. Alternatively, chip LEDs are flip mounted and directly attached to the board 16 using conductive adhesive, solder, thermosonic, or thermo-compression methods. An index matching gel is preferably applied over the chip surface of the chip LEDs. The interconnect system 16 is attached to the heatsink 20 using a thermally conductive compound.

In one embodiment, the control optics are integrated into the enclosure structure. In another embodiment, the control optics are integrated with the LEDs 18.

With continuing reference to FIG. 1, a polymeric sheet or shrink-wrap 30 which includes embedded or substantially dissolved luminophor 32 is shrink-wrapped around the LEDs 18. For example, the luminophor can be phosphor, including organic phosphor, quantum dots, luminescent powder, and the like.

As known in the art, a shrink-wrap is a wrapping which consists of a clear plastic polymeric film that has been stretched during manufacture to be placed around articles, and then shrunk by heat to form a sealed, tight-fitting package. Initially, during the manufacturer's stretching, the molecules of polymer form a series of thin, long lines which are arranged neatly in rows. When the heat is applied to the plastic material, the molecules of the polymer, which have been stretched and oriented during the manufacture of the shrink-wrap material, reconfigure by coiling or rebending into a random polymer state. More specifically, the polymer molecules increase molecular motion, e.g., the molecules start vibrating against each other. As a result, the molecules return to a more natural state. The long lines of molecules begin to coil and tangle tightly with each other, decreasing the volume of the material and producing the shrink-wrap.

Figure 2:
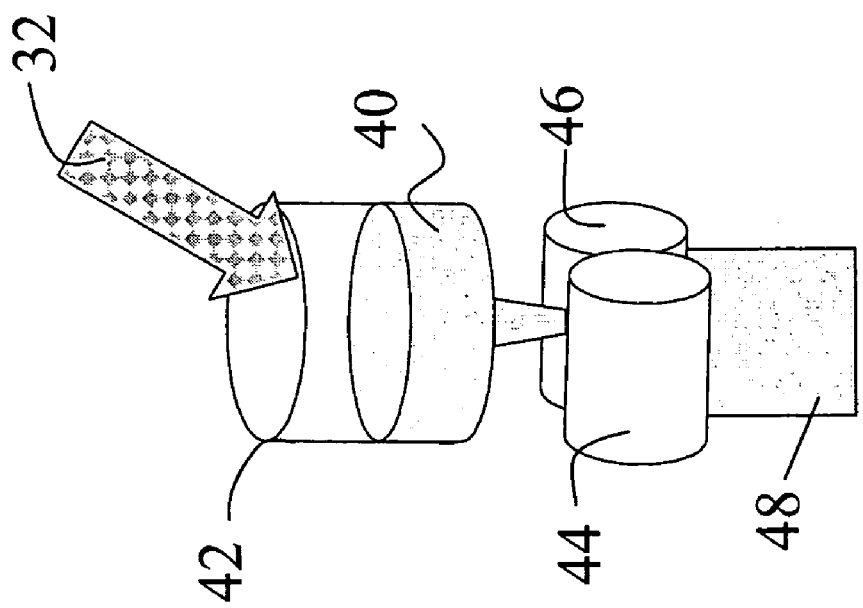
FIG. 2 is an illustration of forming a polymeric phosphor sheet.

With continuing reference to FIG. 1 and further reference to FIG. 2, the luminescent phosphor powder 32, such as, but not limited to, yttrium aluminum garnet activated with $Ce^{3+}$, is embedded in the polymeric wrap material. More specifically, the phosphor powder 32 is added into the polymer with continuous stirring after the polymer is liquefied into a polymeric liquid 40. The phosphor powder 32 acts as a filler in the liquefied polymeric material 40. Any suitable phosphor for use with blue or UV emitting LED chips can be used. The polymeric liquid 40 with the phosphor powder 32 is fed from a reservoir 42 through rollers 44, 46 and stretched or blown out to form a polymeric luminescent or phosphorescent sheet 48 of a precise thickness, from about 40 µm to about 400 µm.

With reference to FIG. 3, the formed polymeric phosphor sheet 48 is rolled into a roll 50. The polymeric phosphor roll 50 is cut into pieces of appropriate sizes as required to produce the shrink-wrap 30 to be wrapped around LEDs 18, enclosure 14 and other objects which can take various shapes and sizes. When heated, the polymeric shrink-wrap 30 shrinks and conforms to the outer surface shape around the object or objects containing the LEDs. Because the pieces of the polymeric phosphor material are cut from the same roll, all such pieces have the same thickness of phosphor which results in uniform phosphor distribution over the object which is shrink-wrapped.

Typically, for the UV emitting LED chip, the phosphor coating is required to be made uniform of approximately 5-7 particles thick over a surface which covers the chip completely. Such phosphor coating generally covers the chip surface completely and hence absorbs nearly all UV radiation incident on the phosphor coating. Such phosphor coating also scatters a minimum amount of the UV light and generated visible light back onto the LED chip. A uniform phosphor thickness of 5-7 particles in the phosphor sheet 48 can be achieved by putting approximately 40 volume percent of the phosphor powder 32 having a particle size of about 6 µm into the polymeric liquid 40 and rolling the polymeric sheet 48 of the thickness d equal to about 40 µm. Such thin sheet is easily shrink-wrapped around the chip and other structures surrounding the chip. Alternatively, a 20 volume percent phosphor is used and the phosphor polymeric sheet 48 with the thickness d equal to about 80 µm is manufactured. If the phosphor particle size is greater than about 6 µm, than the phosphor sheet thickness d becomes proportionately greater. The volume fraction of the phosphor powder 32 is chosen to maintain the necessary flexibility and the shrink-wrap properties of the polymeric phosphor sheet 48. In one embodiment of phosphor polymeric sheet 48, the phosphor material is suspended or dissolved in sheet 48 and the thickness of sheet 48 ranges from about 40 µm to about 400 µm.

In the example of a blue emitting LED chip, the phosphor volume percent and the phosphor sheet thickness d are adjusted similarly to the above description to allow the correct amount of blue light to be transmitted through the shrink-wrap 30 to provide the correct shade of a white light.

In another example, organic phosphors can be used. Many of such phosphors dissolve in the liquefied polymer. The concentration of the polymer can be chosen to absorb the amount of light which needs be converted to achieve the desired white light. The organic luminophors substantially or completely dissolve in the polymeric liquid 40 while maintaining their luminescent properties. Since the organic luminophors are non-scattering, ordinary Beer's law relations can be used to determine the amount of the luminophor needed once the absorption coeffients and efficiency of conversion are known. Examples of the organic phosphors for a use with the present application are the BASF Lumogen F dyes such as Lumogen F Yellow 083, Lumogen F Orange 240, Lumogen F Red 300, and Lumogen F Violet 570. Of course, it is also contemplated that other phosphors such as rare earth complexes with organic ligands that substantially dissolve in the polymeric liquid, such as described in the U.S. Pat. No. 6,366,033, can be used.

In yet another example, quantum dot phosphors as described in the U.S. Pat. No. 6,207,229; nanophosphors as described in the U.S. Pat. No. 6,048,616; or other suitable phosphors can be embedded in the shrink-wrap polymeric material.

Polymeric material, which is used to manufacture the phosphor sheet 48, is transparent to the UV or blue light generated by the chip, and to visible or white light generated by the chip and the phosphor, and does not degrade under the influence of the chip radiation. The examples of the polymeric materials are polyvinyl chloride, polyethylene and polypropylene. Long chain hydrocarbons like polyethylene and polypropylene are substantially UV and blue light radiation tolerant since such hydrocarbons lack double or triple bonds which normally absorb UV and blue light radiation. The ability of the phosphor or luminophor to absorb the radiation further limits the destructive effect of the radiations. The Stoke shift accompanying the absorption of UV or blue radiation by the luminophor heats the polymer further increasing the amount of shrinking and facilitating shrinkage in areas where it is difficult to simply apply heat with hot air flow.

The use of the phosphor sheet 48, which includes the luminescent powder, organic luminophor or quantum dots 32, ensures the correct thickness and a high degree of uniformity of phosphor coating on a given part. Since the phosphor sheet 48 can be manufactured by a continuous rolling process and stored on the large rolls, consistent color control and efficiency from one part to another over many thousands or millions of parts is ensured as many parts use the shrink-wrap 30 which is cut from the roll or rolls 50 made from the same batch of the polymeric material 40 and the phosphor powder 32. Such process achieves a substantial improvement over slurry coatings which are not uniform on the same part and for which thickness and uniformity and hence optical properties of the resulting LED light cannot be controlled from one part to another. In addition, a loss of phosphor compared to a coating with a slurry is reduced since extra pieces of the phosphor sheet 48 can be cut and stored for future use.

With reference again to FIG. 1, the board 16 with the LEDs 18 is initially covered with the shrink-wrap 30. Next, the phosphor including shrink-wrap 30 is heated. As a result of heating, the phosphor including shrink-wrap 30 shrinks to conform to the outer surface of the LEDs 18 and areas of the board 16 adjacent the LEDs 18. Excess material is cut away and reused.

Figure 4:
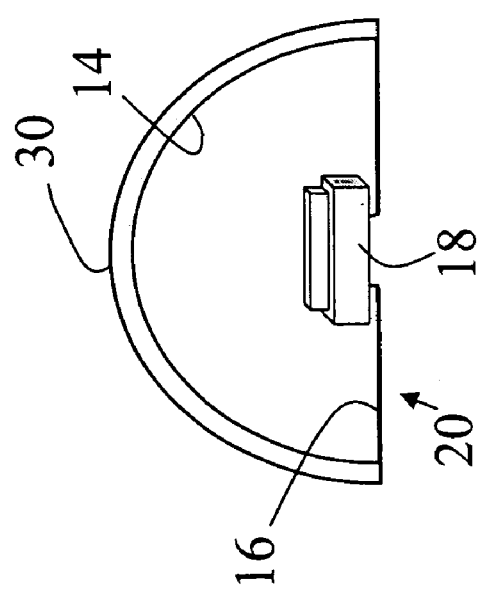
FIG. 4 is a schematic view of another LED lighting assembly.

With reference to FIG. 4, the luminescent shrink-wrap 30 is positioned about the enclosure 14 remotely from the LEDs 18. The enclosure 14 is a transparent or translucent hemisphere for improved efficiency. Of course, it is also contemplated that the enclosure 14 can be of any suitable shape. The LEDs 18 are disposed on the mounting surface 16 such as a bottom surface of the enclosure 14 and are surrounded by the enclosure 14. The mounting surface 16 is highly reflective of light and provides a heat sink for the LEDs 18. The remote coating of the LEDs results in improved efficiency on the order of 30-60% due to the fact that the light, radiated by the phosphor and directed back into the LED device, strikes other areas covered by phosphor rather than striking the chip and mount structure which are highly absorbing. Such remote coating design is described in copending International Patent Published Application WO 2004/021461, titled "Coated LED with Improved Efficiency", by Soules, filed 29 Aug. 2003, and copending International Patent Published Application WO 2004/100226, titled "Method and Apparatus for LED Panel Lamp Systems", by Weaver, filed 5 May 2004, which are totally incorporated herein by reference.

In another embodiment, the engine 12 includes enclosure 14 surrounding a radiation generating area of engine 12 to at least substantially encompass the radiation emitted from the light emitting diode. The embodiment further includes polymeric layer 48 shrink-wrapped about enclosure 14 and defining an air gap between polymeric layer 48 and light emitting diode 18. Enclosure 14 has a shape of a hemisphere with a bottom plane of hemisphere serving to support the light emitting diode 18 and to provide a heat sink.

Figure 5:
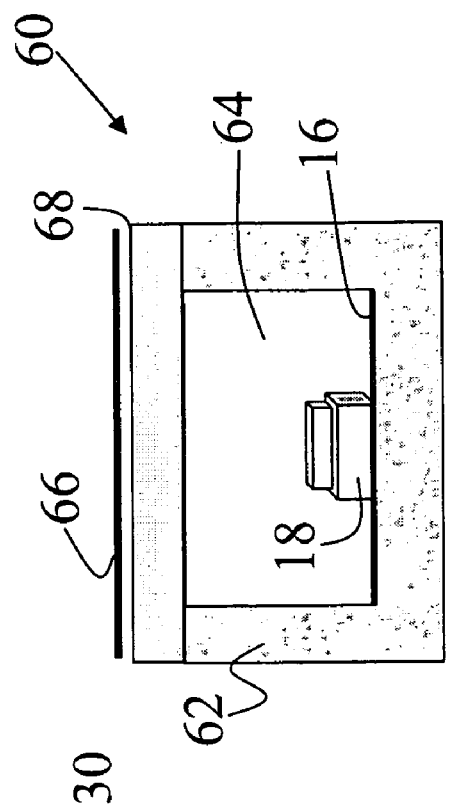
FIG. 5 is a schematic view of another LED lighting assembly.

With reference to FIG. 5, the phosphor shrink-wrap 30 is used for an LED backlight 60 such as an LED backlight display. The LED or LEDs 18 are positioned on the mounting surface 16. A reflector 62 surrounds the LED 18 and the mounting surface 16. The phosphor shrink-wrap 30 is placed over a cavity 64 of the reflector 62. The light-transmissive display 66 is placed over a light emitting or first surface 68 of the shrink-wrap 30.

Figure 6:
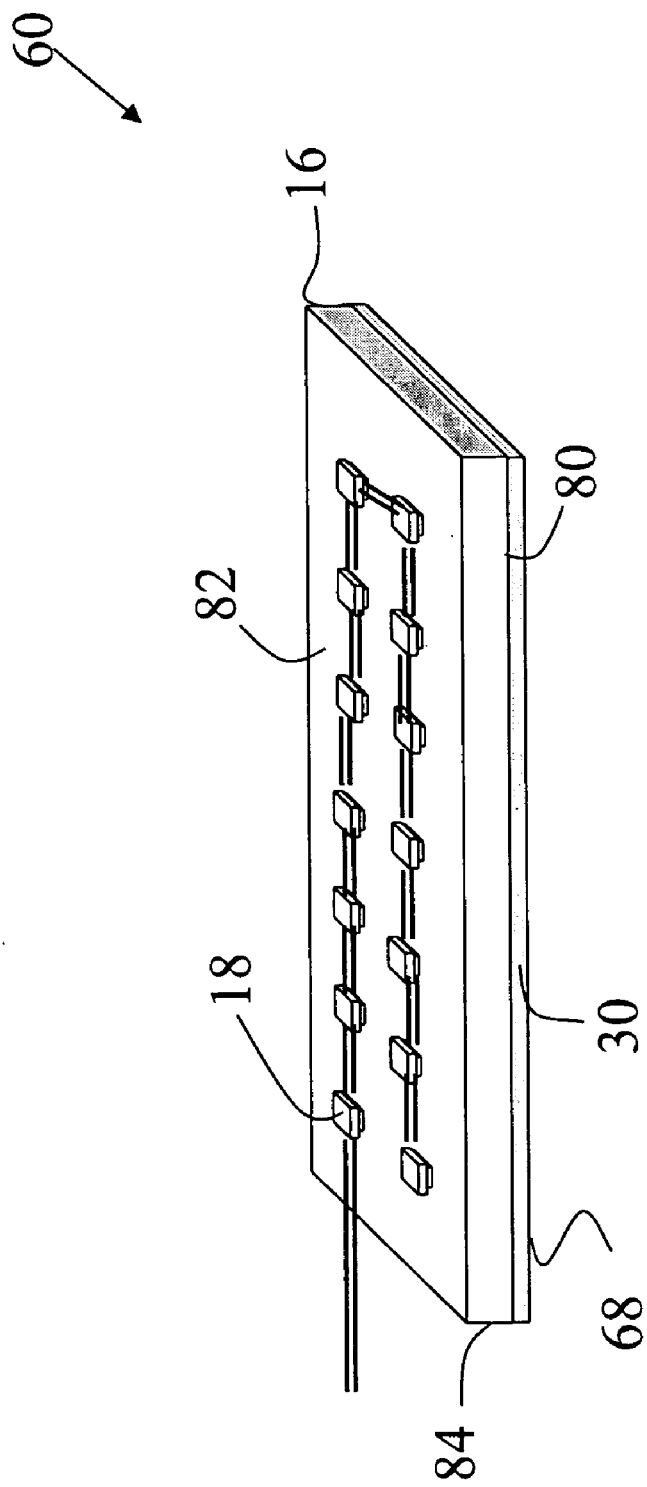
FIG. 6 is a schematic view of yet another LED lighting assembly.

With reference to FIG. 6, the phosphor shrink-wrap 30 is placed around a distal or first surface 80 of the board 16. A plurality of LEDs 18 are disposed on a mounting or second surface 82 of the board 16. Because all LEDs 18 are covered with the shrink-wrap 30 of the uniform phosphor thickness, the emitted visible light is a diffused white light over the entire shrink-wrap light emitting surface 68. In one embodiment, the board 16 is translucent or transparent in more than one direction. The shrink-wrap 30 is shrink-wrapped around the distal surface 80 and around at least one other surface which defines the translucent direction, for example, such as one of side surfaces 84.

Typically, the phosphors for the lighting system 10 are selected for high efficiency and proper color during the light system 10 operation. Preferably, the phosphors are selected to yield color temperatures (CCTs) ranging from 2500 to 10000 K and color rendering indices (CRIs) ranging from 50 to 99 in the final device (which may include a substantial bleed from the LED chips). By storing polymeric luminescent sheets as rolls with differing phosphor contents, the phosphor blend or concentration are readily changed by simply choosing the appropriate roll to create a wide variety of color temperatures, color points or CRIs for an individual user without changes to the light engine 12.

In one embodiment, the phosphor distribution is non-uniform to create preselected patterns, figures, special visual effects of different colors, and other effects.

In one embodiment, the rolls 50 of luminescent shrink-wrap with different phosphors or different concentrations are stored and labeled by the color produced when used to cover blue or UV LEDs. Rolls of polymeric material with different phosphor mixtures or different ratios of phosphors or different phosphors can be selected at point of final assembly. Based on the volume of customer orders sections can be cut from one or another sheet and applied to the LED assembly. This will provide great flexibility in manufacturing and wide customer choice as to the lamp colors and color rendition capability. In this manner, the colors can be customized on receipt of orders rather than maintaining an expensive inventory or various white or colored LEDs. By supplying a customer with LEDs all made using sheet cut from the same roll would ensure the greatest lamp-to-lamp color uniformity.

The application has been described with reference to the preferred embodiments. Modifications and alterations will occur to others upon a reading and understanding of the preceding detailed description. It is intended that the application be construed as including all such modifications and alterations insofar as they come within the scope of the appended claims or the equivalents thereof.

The invention claimed is:

1. A lighting apparatus, comprising:
    at least one light emitting diode which is disposed on an interconnect board to emit ultraviolet or blue radiation, which light emitting diode includes:
        a first surface to emit radiation, and
        a second surface disposed opposite the first surface; and
        a polymeric sheet including a luminophor which is disposed about the lighting apparatus to convert at least a portion of the radiation emitted from the light emitting diode into visible light, the polymeric sheet comprised of polymer molecules that are in a state between stretched and natural.

2. The apparatus of claim 1, wherein the polymeric sheet further comprises at least a phosphor material.

3. The apparatus of claim 2, wherein the phosphor is one of:
- an inorganic luminescent powder;
- an organic luminophor which substantially dissolves in the polymer; and
- a nano-particle material.

4. The apparatus of claim 2, wherein the polymeric sheet further includes:
- a polymeric material which is liquefied to one of suspend or dissolve the phosphor material and rolled into a polymeric sheet.

5. The apparatus of claim 4, wherein a thickness of the polymeric sheet is equal to from about 40 µm to about 400 µm.

6. The apparatus of claim 1, wherein the polymeric sheet includes at least one of:
- polyvinyl chloride,
- polyethylene, and
- polypropylene.

7. The apparatus of claim 1, further including:
- an enclosure surrounding a radiation generating area of the light apparatus to at least substantially encompass the radiation emitted from the light emitting diode.

8. The apparatus of claim 7, wherein the polymeric sheet is tightly shrink-wrapped over the light emitting diode first surface to completely cover at least the light emitting diode first surface and portions of the interconnect board adjacent the light emitting diode second surface.

9. The apparatus of claim 8, wherein the polymeric sheet comprises at least a phosphor which is substantially uniformly distributed over the light emitting diode first surface and portions of the interconnect board adjacent the light emitting diode second surface.

10. The apparatus of claim 7, including an air gap between the light emitting diode and the radiation converting polymeric sheet.

11. The apparatus of claim 10, wherein the enclosure has a shape of a hemisphere with the bottom surface of the hemisphere serving to support the light emitting diode and provide a heatsink.

12. The apparatus of claim 1, wherein the interconnect board is transparent at least in the direction of the light emitting diode second surface, which transparency defines at least one light escaping surface of the interconnect board.

13. The apparatus of claim 12, wherein the polymeric sheet is shrink-wrapped around the light escaping surface of the board.

14. The apparatus of claim 1, wherein the interconnect board has a high index of refraction and makes optical contact with the light emitting diode chip and the polymeric layer.

15. The apparatus of claim 1, further including:
- a heatsink disposed on a side of the circuit board opposed to the light emitting diode to dissipate heat generated by the light emitting diode.

16. The apparatus of claim 15, wherein the heatsink includes a plurality of wings.

17. The apparatus of claim 1 further including an enclosure surrounding a radiation generating area of the apparatus wherein the sheet located next to the enclosure and remotely from the diode.

18. The apparatus of claim 1 wherein the sheet located remotely from the diode, whereby a surface area of the sheet comprises at least 10 times the surface area of the diode and a mount structure of the diode.

19. An illumination device comprising:
- a light-transmissive display;
- a backlight arranged to illuminate the light-transmissive display, the backlight including:
  - at least one light emitting diode to emit radiation;
  - a reflector to reflect the emitted radiation into the light-transmissive display, the reflector including a reflector cavity defining an air gap above the light emitting diode; and
- a luminescent shrink-wrap which is disposed to cover the reflector cavity and convert the reflected radiation into visible light, which shrink-wrap includes:
  - a first surface disposed proximately to the light emitting diode to receive the emitted radiation, and
  - a second surface disposed distally from the light emitting diode to emit visible light;
  - wherein the shrink-wrap comprises polymer molecules that are in a state between stretched and natural polymer.

20. The device of claim 19, wherein the shrink-wrap comprises at least phosphor.

21. The device of claim 20, wherein the phosphor is one of:
- an inorganic luminescent powder;
- a rare earth complex;
- an organic luminophor; and
- a nano-particle material.

22. The device of claim 20, wherein the shrink-wrap further includes:
- a polymeric material which is liquefied to one of suspend or dissolve the phosphor and rolled into a phosphor including polymeric sheet.

23. The device of claim 20 wherein the phosphor uniformly distributed within the shrink-wrap which covers the reflector cavity.

24. The device of claim 19, wherein the shrink-wrap includes at least one of:
- polyvinyl chloride,
- polyethylene, and
- polypropylene.

25. The device of claim 19 wherein the light emitting diode aligned horizontally below the luminescent shrink-wrap.

26. The device of claim 19 wherein the air gap located adjacent the light emitting diode.

27. The device of claim 19 wherein the shrink-wrap disposed a distance from the diode whereby a surface area of the wrap comprises at least 10 times the surface area of the diode and a mount structure for the diode.

* * * * *